United States Patent
Huang et al.

(10) Patent No.: US 9,239,895 B2
(45) Date of Patent: Jan. 19, 2016

(54) PERIODIC MEDIA ANALYSIS

(75) Inventors: Qingping Huang, Lincoln, RI (US);
Victor George Oancea, East Greenwich, RI (US); William John Grimes, Cohasset, MA (US)

(73) Assignee: Dassault Systèmes Simulia Corp., Johnston, RI (US)

( * ) Notice: Subject to any disclaimer, the term of this patent is extended or adjusted under 35 U.S.C. 154(b) by 297 days.

(21) Appl. No.: 13/310,237

(22) Filed: Dec. 2, 2011

(65) Prior Publication Data
US 2013/0144572 A1 Jun. 6, 2013

(51) Int. Cl.
*G06F 7/60* (2006.01)
*G06F 17/50* (2006.01)

(52) U.S. Cl.
CPC .................. *G06F 17/5018* (2013.01)

(58) Field of Classification Search
CPC ............ G06F 17/5018; G06F 2217/12; G06F 2217/32; G06F 17/509; G06F 17/5009; G01B 11/24; G03F 7/70625; G03F 7/705
USPC .......................................................... 703/2
See application file for complete search history.

(56) References Cited

U.S. PATENT DOCUMENTS

| | | | | |
|---|---|---|---|---|
| 4,526,431 A | * | 7/1985 | Kasukawa | 439/153 |
| 4,742,473 A | | 5/1988 | Shugar et al. | |
| 5,826,736 A | * | 10/1998 | Weber | 213/75 A |
| 7,664,623 B1 | | 2/2010 | Hallquist | |
| 2004/0122630 A1 | | 6/2004 | Fife | |
| 2004/0236457 A1 | * | 11/2004 | Stabelfeldt et al. | 700/132 |
| 2004/0236552 A1 | * | 11/2004 | Pieper et al. | 703/6 |
| 2008/0010597 A1 | * | 1/2008 | Seemann et al. | 715/723 |
| 2008/0172208 A1 | * | 7/2008 | Lechine | 703/1 |
| 2008/0195342 A1 | * | 8/2008 | Li et al. | 702/82 |
| 2009/0240714 A1 | * | 9/2009 | Keith et al. | 707/100 |
| 2010/0010782 A1 | | 1/2010 | Zhu et al. | |

OTHER PUBLICATIONS

Diaz et al. ("Non-linear analysis and warping of tubular pipe conveyors by the finite element method", 2007, Elsevier, pp. 95-108).*
ABAQUAS Lecture Topics ("Constraints and Connections" ABAQUS inc. 2005, pp. 1-56).*

* cited by examiner

Primary Examiner — Omar Fernandez Rivas
Assistant Examiner — Iftekhar Khan
(74) Attorney, Agent, or Firm — Hamilton, Brook, Smith & Reynolds, P.C.

(57) ABSTRACT

A computer-implemented method for use in analyzing a model of a repetitive structure includes generating a plurality of blocks based on the model such that the blocks are arranged end to end. The method also includes defining at least one boundary condition on an inlet of the model and on an outlet of the model, generating a plurality of constraints to be applied to the blocks to define connectivity between adjacent blocks, defining an inlet state based on the boundary condition and at least a portion of the constraints. The method further includes detecting when a first block passes a trigger plane at the inlet of the model, erasing a state of a second block at the outlet of the model, shuffling the second block to an inlet zone, and resetting the state of the second block to the inlet state.

17 Claims, 5 Drawing Sheets

PERIODIC MEDIA ANALYSIS

BACKGROUND OF THE INVENTION

The embodiments described herein relate generally to numerical simulation and, more particularly, to using numerical simulation to model a manufacturing process.

At least some known modeling solutions use finite element modeling (FEM) software to model a long section of material that is transported through a process zone. However, such solutions are generally resource intensive and require long processing times, large amounts of available disk space, and additional computer memory. Post-processing may also be negatively affected. For example, in order to avoid the large data requirements and associated run times, one or more model changes can be performed as the analysis progresses. In one such model change, material at an exit or outlet of the process zone is removed and new material is added at an entrance or inlet of the process zone. However, such model changes can cause disruptions in the modeling solution. Moreover, such model changes are not automated and are required at frequent intervals during the simulation.

Another known solution involves modeling the material using only shell elements. The shell elements must be meshed as a continuous loop of elements with the elements that connect to the inlet of the process zone made inactive. As elements exit the process zone through the outlet, they are deactivated and reactivated at the inlet. This solution mitigates the processing and memory requirements described above, but can only be applied to homogenous flat sheet situations. Real life manufacturing processes rarely involve homogenous flat sheets but, instead, involve items situated on top of a belt such that these solutions are incapable of accurate modeling. Furthermore, such known solutions simulate the attachment between sections using a single row of nodes through the thickness of the section.

BRIEF DESCRIPTION OF THE INVENTION

In one aspect, a computer-implemented method is provided for use in analyzing a model of a repetitive structure. The method includes generating a plurality of blocks based on the model such that the blocks are arranged end to end. The method also includes defining at least one boundary condition on an inlet of the model and on an outlet of the model, generating a plurality of constraints to be applied to the blocks to define connectivity between adjacent blocks, defining an inlet state based on the boundary condition and at least a portion of the constraints. The method further includes detecting when a first block passes a trigger plane at the inlet of the model, erasing a state of a second block at the outlet of the model, and resetting the state of the second block to the inlet state.

In another aspect, a computer is provided for use in analyzing a model of a repetitive structure. The computer includes a memory area and a processor operatively coupled to the memory area. The processor is configured to generate a plurality of blocks based on the model such that the plurality of blocks is arranged end to end and store data representative of the plurality of blocks in the memory area. The processor is also configured to define at least one boundary condition on an inlet of the model and on an outlet of the model, automatically generate a plurality of constraints to be applied to the blocks to define connectivity between adjacent blocks, and define an inlet state based on the boundary condition and at least a portion of the constraints. The processor is further configured to detect when a first block passes a trigger plane at the inlet of the model, erase a state of a second block at the outlet of the model, reset the state of the second block to the inlet state, and store data representative of the operation of the model in the memory area.

In another aspect, a computer program product is provided for use in analyzing a model of a repetitive structure. The computer program product includes one or more computer-readable storage media having computer-executable components. The components include a construction component that when executed by a processor causes the processor to generate a plurality of blocks based on the model such that the blocks are arranged end to end. A rules component causes the processor to define at least one boundary condition on an inlet of the model and on an outlet of the model, generate a plurality of constraints to be applied to the blocks to define connectivity between adjacent blocks, and define an inlet state based on the boundary condition and at least a portion of the constraints. An analysis component causes the processor to detect when a first block passes a trigger plane at the inlet of the model, erase a state of a second block at the outlet of the model, and reset the state of the second block to the inlet state.

BRIEF DESCRIPTION OF THE DRAWINGS

The details of one or more embodiments of the invention are set forth in the accompanying drawings and the description that follows. Other features, objects, and advantages of the invention will be apparent from the description and drawings, and from the claims.

DETAILED DESCRIPTION OF THE INVENTION

Exemplary embodiments of systems, methods, apparatuses, and computer program products for use in analyzing a model of a repetitive structure are described herein. For example, the embodiments described herein provide a technique that can be effectively used to model systems that are repetitive in nature, such as manufacturing processes involving conveyor belts or continuous forming operations. The embodiments described herein facilitate reducing the model size to enhance processing speed and to reduce the amount of required disk space and computer memory. The embodiments described herein also facilitate simplifying creation of the model such that only one part mesh is needed and is then instantiated as many times as necessary to complete the length of product to be analyzed. Moreover, many element types can be used to mesh the part including, but not limited to, solids, shells, beams, and trusses. Furthermore, the embodiments described herein enable one or more constraints to be defined within each part.

Exemplary technical effects of the systems, methods, apparatuses, and computer program products described herein include taking a manually-driven import workflow and automating it by dividing the model into repeated identical sections and shuffling the sections from the process zone outlet to the inlet. The state of the section associated with the outlet is wiped out and replaced with the saved state of the inlet. Moreover, the sections are not linked together through connectivity but rather by node-to-node tie constraints. The tie constraints are individually uncoupled from a following section when shuffling the outlet section to the inlet, where the tie constraints are then individually re-coupled to a leading section at the inlet.

Figure 1:
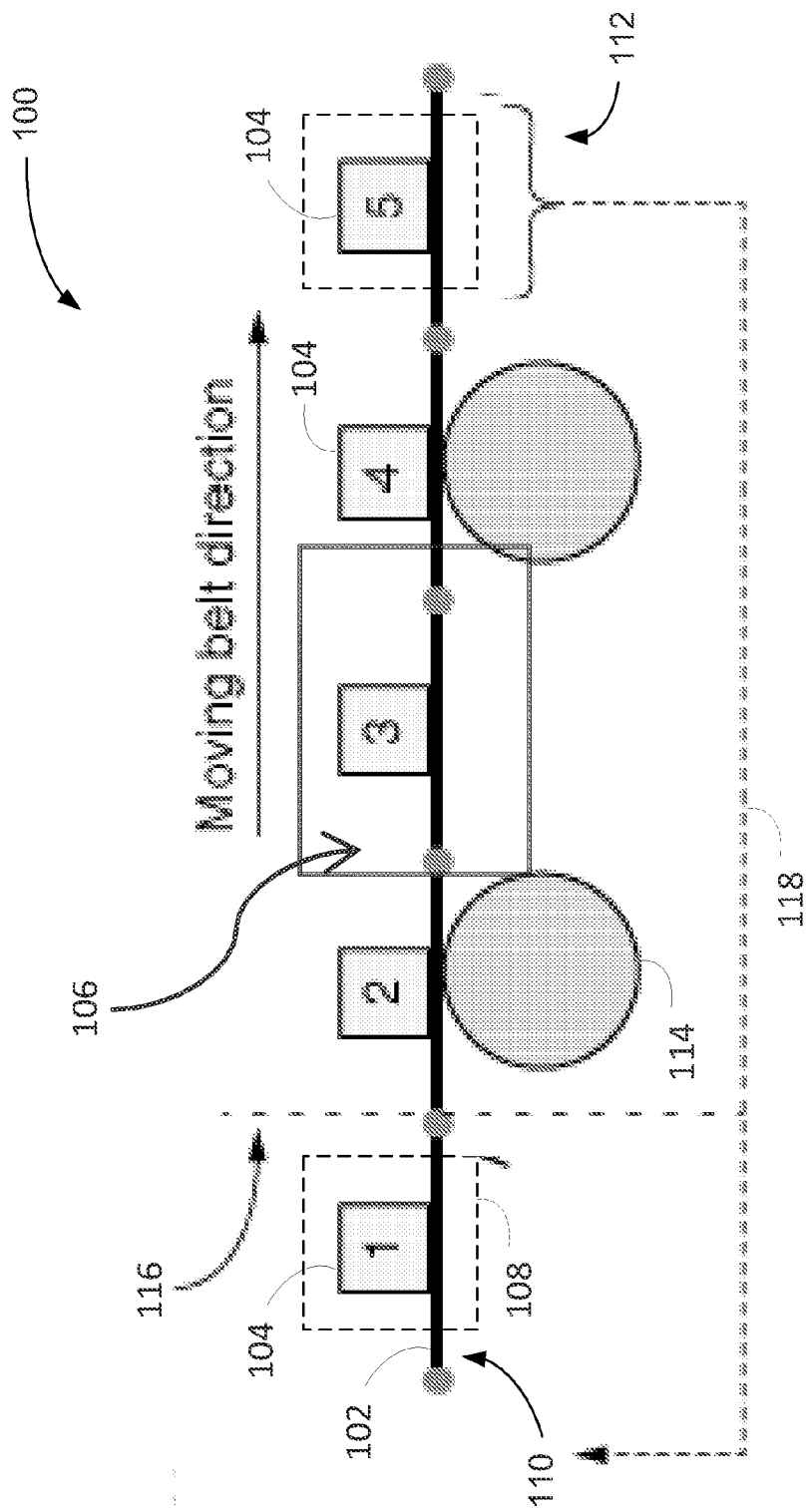
FIG. 1 is a block diagram that illustrates an exemplary industrial process zone.

FIG. 1 is a block diagram that illustrates an exemplary industrial process zone 100 that can be analyzed using the systems, methods, apparatuses, and computer program products described herein. Specifically, FIG. 1 shows a conveyor belt 102 that supports and facilitates movement of a plurality of regularly spaced packages 104 through a zone of interest 106. The overall model can be decomposed into blocks 108 that are connected together and span the process zone 100. As used herein, the term "block" refers generally to a topologically identical meshed structure. More specifically, a block 108 is defined as a meshed structure that is repeated to model the entire periodic media. In an exemplary embodiment, a series of blocks 108 is used to construct the model. The embodiments described herein provide a simple way to automatically connect these blocks 108 at the front and back ends of adjacent blocks 108. Moreover, the embodiments described herein provide a convenient way to define loads and boundary conditions that represent the physical system at the unconnected ends of the first and last blocks 108 in the chain. The first block 108 in the chain is referred to as the inlet 110, and the last block 108 in the chain is referred to as the outlet 112. As described in greater detail below, when the periodic media moves through the process zone 100, blocks 108 from the outlet 112 are automatically shuffled to the inlet 110. The blocks 108, or meshed structures, defined with this technique interact via contact with other modeling features that are not periodic in nature, such as rollers 114.

The periodic media analysis technique described herein facilitates shuffling blocks 108 from the outlet 112 back to the inlet 110. As such, described herein are systems, methods, apparatuses, and computer program products for use in detecting when the inlet 110 has moved beyond a predefined trigger plane 116 and to shuffle a block 108 from the outlet 112 to the inlet 110. Arrow 118 illustrates the shuffling process. To ensure a smooth transition, and as described in greater detail below, the necessary nodal and element state data from the inlet block 110 are stored at the beginning of analysis. When shuffling occurs, the stored nodal and element state data are mapped to the new inlet block 110 and any inlet and/or outlet loads and/or boundary conditions are transferred to the newly exposed block ends 110 and 112. Accordingly, the embodiments described herein facilitate a view into a moving repetitive structure to, for example, assess the package dynamics on the belt at a location somewhere between the rollers in both transient and stead-state conditions.

Figure 2:
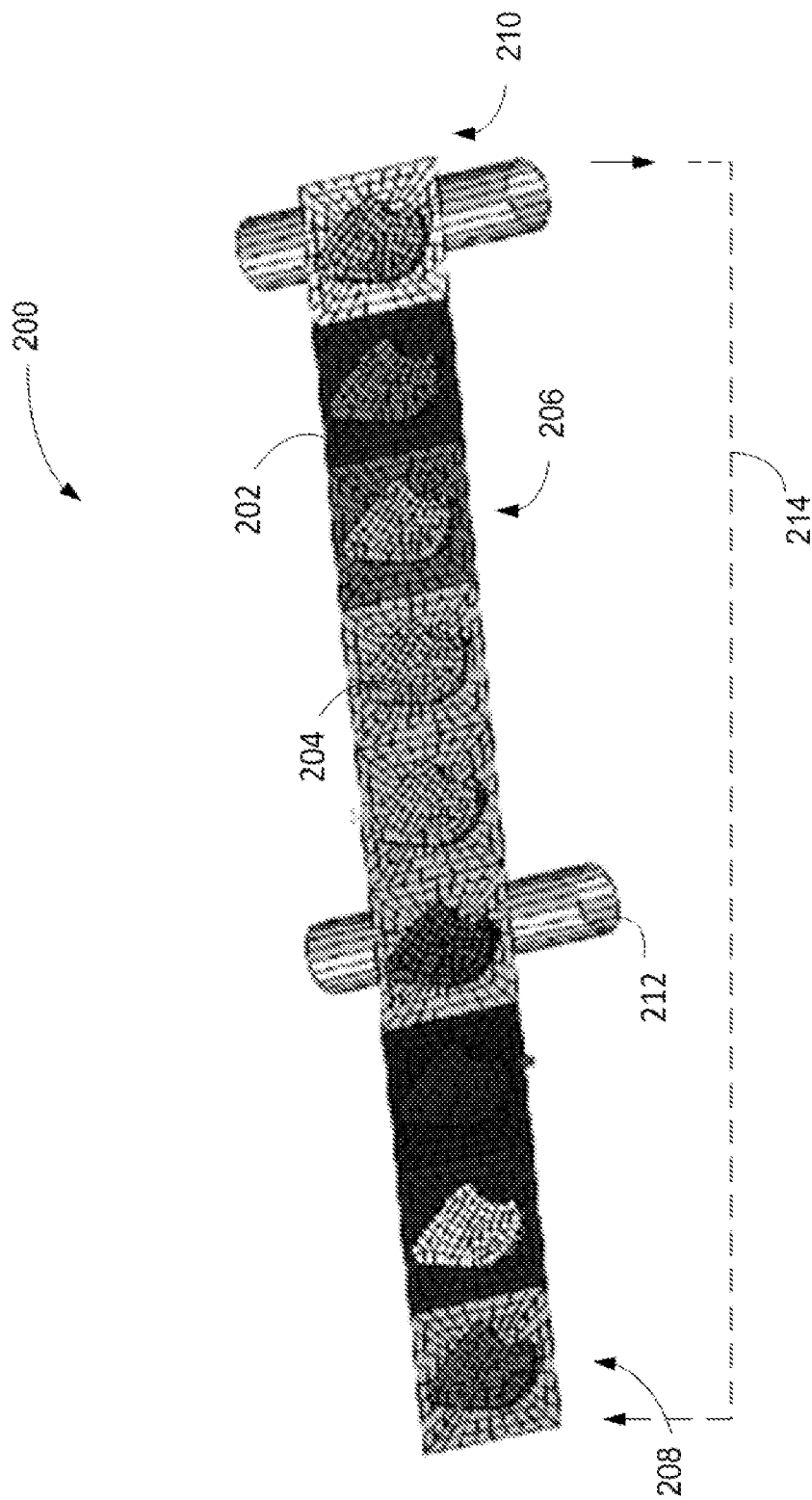
FIG. 2 is a perspective view of a model of the industrial process zone shown in FIG. 1.

FIG. 2 is a perspective view of a model 200 of the industrial process zone 100 shown in FIG. 1. As shown in FIG. 2, the elements of the process zone 100 are recreated in a three-dimensional (3D) view. For example, the conveyor belt 102 that supports and facilitates movement of a plurality of regularly spaced packages 104 (each shown in FIG. 1) is created in the 3D view as belt 202 and packages 204. Moreover, the overall model 200 can be decomposed into blocks 206 that are connected together and span the process zone 100. Similar to FIG. 1, the first block 206 in the chain is referred to as the inlet 208, and the last block 206 in the chain is referred to as the outlet 210. As described in greater detail below, when the periodic media moves through the process zone 100 in the model 200, blocks 206 from the outlet 210 are automatically shuffled to the inlet 208. The blocks 206 may also interact via contact with other modeling features that are not periodic in nature, such as rollers 212.

The periodic media analysis technique described herein facilitates shuffling blocks 206 from the outlet 210 back to the inlet 208. In an exemplary embodiment, analysis of the model 200 detects when the inlet 208 has moved beyond a predefined trigger plane 116 (shown in FIG. 1) and causes a block 206 to shuffle from the outlet 210 to the inlet 208. Arrow 214 illustrates the shuffling process. To ensure a smooth transition, and as described in greater detail below, the necessary nodal and element state data from the inlet block 208 are stored at the beginning of analysis. When shuffling occurs, the stored nodal and element state data are mapped to the new inlet block 208 and any inlet and/or outlet loads and/or boundary conditions are transferred to the newly exposed block ends 208 and 210. Accordingly, the embodiments described herein facilitate a view into a moving repetitive structure to, for example, assess the package dynamics on the belt at a location somewhere between the rollers in both transient and stead-state conditions.

Figure 3:
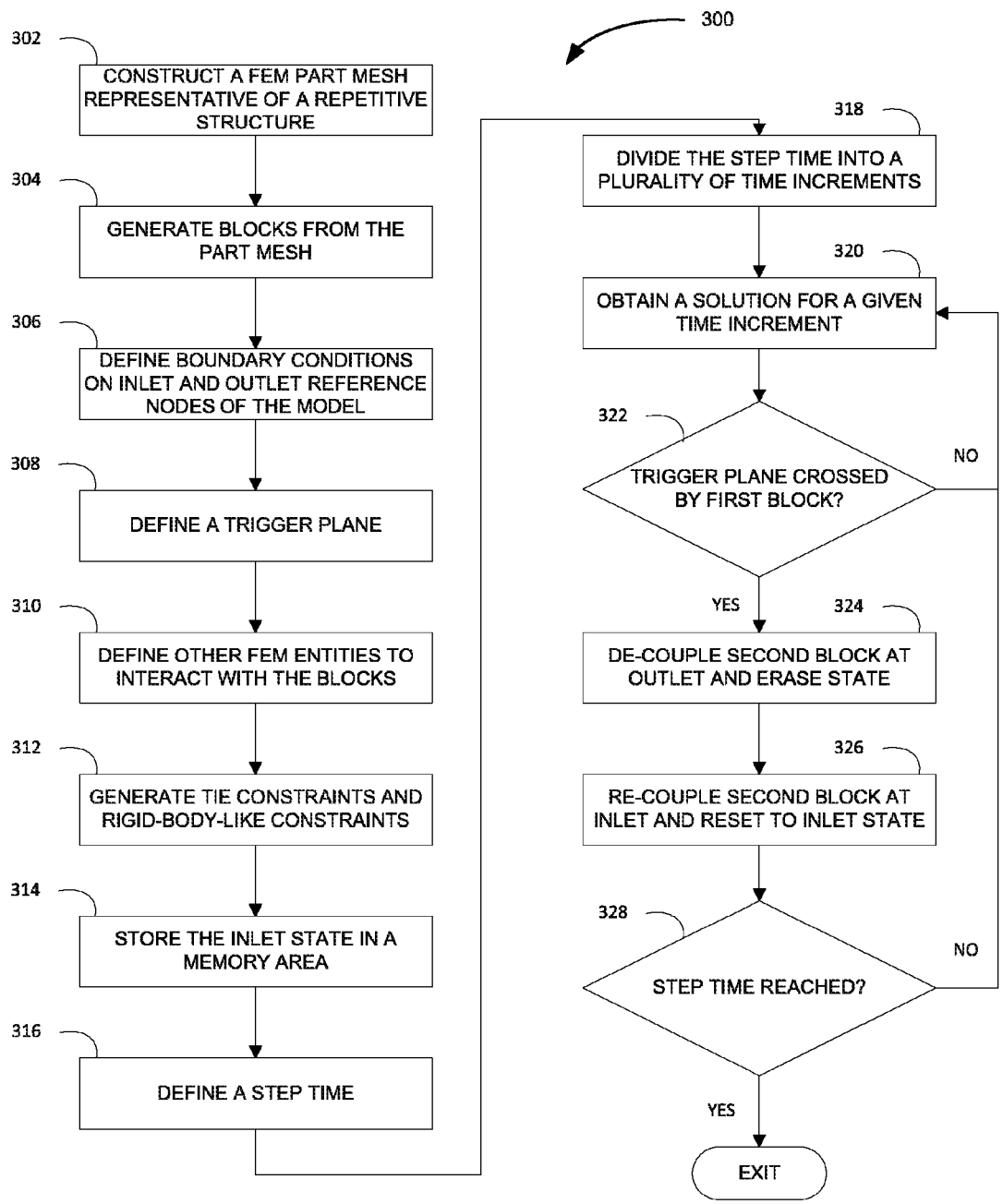
FIG. 3 is a flowchart that illustrates an exemplary computer-implemented method for analyzing a finite element model of a repetitive structure.

FIG. 3 is a flowchart 300 that illustrates an exemplary computer-implemented method for analyzing a finite element model of a repetitive structure, such as a periodic media transport mechanism or conveyor. In an exemplary embodiment, a finite element model (FEM) part mesh is constructed 302 to be representative of the repetitive structure. The FEM part mesh is then divided to generate 304 a plurality of instances or blocks. In some embodiments, the geometry of the blocks is identical. However, identical geometry is not required for the method to operate. Accordingly, in alternative embodiments, the geometry of the blocks is not identical. Moreover, in an exemplary embodiment, the topology of the blocks is identical. In some embodiments, the blocks are automatically generated based on preselected or predetermined specifications. In alternative embodiments, the blocks are generated based on user-defined specifications.

When generating the blocks, the process described herein uses an unsorted element set and an unsorted node set. The unsorted element set is defined to include all elements of the block, and the unsorted node set is defined to include all nodes of the block. In an exemplary embodiment, and to ensure proper transfer of information as the period media advances, these unsorted sets should be topologically identical to each other. One way to achieve this is to define one block, including the unsorted element and node sets, and to then instantiate the block as many times as necessary to create the periodic media mesh model. The block can also include constraints, such as ties and/or couplings. Moreover, rigid body constraints are allowed in the block. However, the constraints should be identical for every block once instantiated.

In an exemplary embodiment, the block instances are connected to create the continuous model. The blocks may be embodied as shells or as continuum elements. If the block is embodied as a shell, a plurality of nodes on each of the leading and trailing edges of the block is used to connect adjacent blocks. If the block is embodied as a continuum element, a plurality of nodes on each of the leading and trailing faces of the block is used to connect to adjacent blocks. However, the nodal arrangements on the leading and trailing connecting ends of the block should be topologically identical, the nodes on the leading and trailing connecting ends of the block should be coincident, the nodes on the leading and trailing connecting ends of the block should have coordinates that differ only according to a rigid body translation, and two node-based surfaces should be created using unsorted node sets at the leading and trailing connecting ends of the block.

In an exemplary embodiment, one or more boundary conditions are defined 306 on reference nodes at an inlet and an outlet of the model. As described above, the inlet section is defined as the first block of the model and the outlet section is defined the last block of the model. The boundary conditions should cause the model to move from the inlet towards the outlet as would a periodic media transport mechanism or conveyor. In some embodiments, the boundary conditions are automatically defined based on preselected or predetermined specifications. In alternative embodiments, the boundary conditions are defined based on user-defined specifications.

A trigger plane is also defined 308 to indicate the geometric region of the model where a valid FEM mesh always exists. Similar to definition of the boundary conditions, definition of the trigger plane may be automatic based on preselected or predetermined specifications or may be based on user-defined specifications. The trigger plane controls the timing of the shuffling or movement of the outlet block to the inlet of the model. When the trailing nodes of the previous inlet block pass the trigger plane, the shuffling process is activated. In an exemplary embodiment, the trigger plane is defined using the coordinates of a stationary node and the z-axis of a user-defined orientation.

In an exemplary embodiment, other FEM entities are also defined 310 that interact with the blocks. These FEM entities may include, but are not limited to only including, rollers or other mechanisms for advancing the conveyor.

A plurality of constraints, including tie constraints and/or rigid-body-like constraints, is defined 312 and applied to the blocks. The tie constraints define how adjacent blocks are coupled and de-coupled and may be node-to-node constraints, surface-to-surface constraints, or any other suitable type of tie constraint that enables the analysis described herein. For example, node-to-node constraints define that nodes along a leading edge of a trailing block are coupled to opposing nodes along a trailing edge of a leading block. Surface-to-surface constraints define that nodes along a leading surface of a trailing block are coupled to opposing nodes along a trailing edge of a leading block. One example of a load is a pre-tension load applied to the inlet to keep the conveyor belt taut. One example of a boundary condition is a velocity prescription applied to the outlet. As the model is analyzed and exiting blocks are shuffled from the outlet to the inlet, the blocks requiring the boundary conditions change. However, the embodiments described herein enable application of the boundary conditions via two control nodes that are associated with the current inlet and outlet node-based surfaces. The control nodes are similar to reference nodes and impose automatically-defined, rigid body-like constraints on the blocks at the extreme ends of the model. In addition, a second rigid body-like constraint can be applied to the front end nodes of the inlet block such that, when exiting blocks are shuffled or moved back to the inlet, the process applies the second rigid body-like constraint is applied to the front end nodes of the new inlet block and removed from the front end nodes of the previous inlet block.

In an exemplary embodiment, after construction of the model and prior to the start of analysis, the inlet state is stored 314 in a memory area for later reuse. In some embodiments, the states of other blocks in the model, such as the outlet state, are also stored in the memory area. Also prior to analysis, a step time is defined 316. In some embodiments, the step time is automatically defined based on preselected or predetermined specifications. In alternative embodiments, the step time is defined based on user-defined specifications. In an exemplary embodiment, the step time is divided 318 into a plurality of time increments. The number of increments may be based on preselected or predetermined specifications or may be user-defined.

For each time increment, a computer obtains 320 a solution to the model based on the most recently saved block positions and states. In an exemplary embodiment, the solution for each time increment is stored in a memory area for subsequent analysis. After the solution is obtained 320 for a given time increment, it is determined 322 whether a first block, i.e., the block at the inlet of the model, crosses the previously-defined trigger plane. If the trigger plane is crossed, a second block, i.e., the block at the outlet of the model, is moved from the outlet to the inlet. For example, the second block is de-coupled 324 from a third block that is adjacent to and trails the second block within the model and the state of the second block is erased. Specifically, the tie constraints between the second block and the third block are ruptured. More specifically, each tie constraint on the second block is de-coupled from an opposing tie constraint on the third block. The second block is then moved to the inlet of the model, where it is re-coupled 326 to the first block and reset to the previously saved inlet state. Specifically, the tie constraints between the first block and the second block are formed. More specifically, each tie constraint on the first block is coupled to an opposing tie constraint on the second block. In an exemplary embodiment, if the trigger plan is not crossed the blocks remain as they are and the existing constraints are maintained.

Moreover, in an exemplary embodiment, it is determined 328 whether the defined step time has been reached. If the step time has been reached, based on whether a solution has been obtained for all of the time increments, the method is ended. If the step time has not been reached, a solution is obtained 320 for the next time increment.

Figure 4:
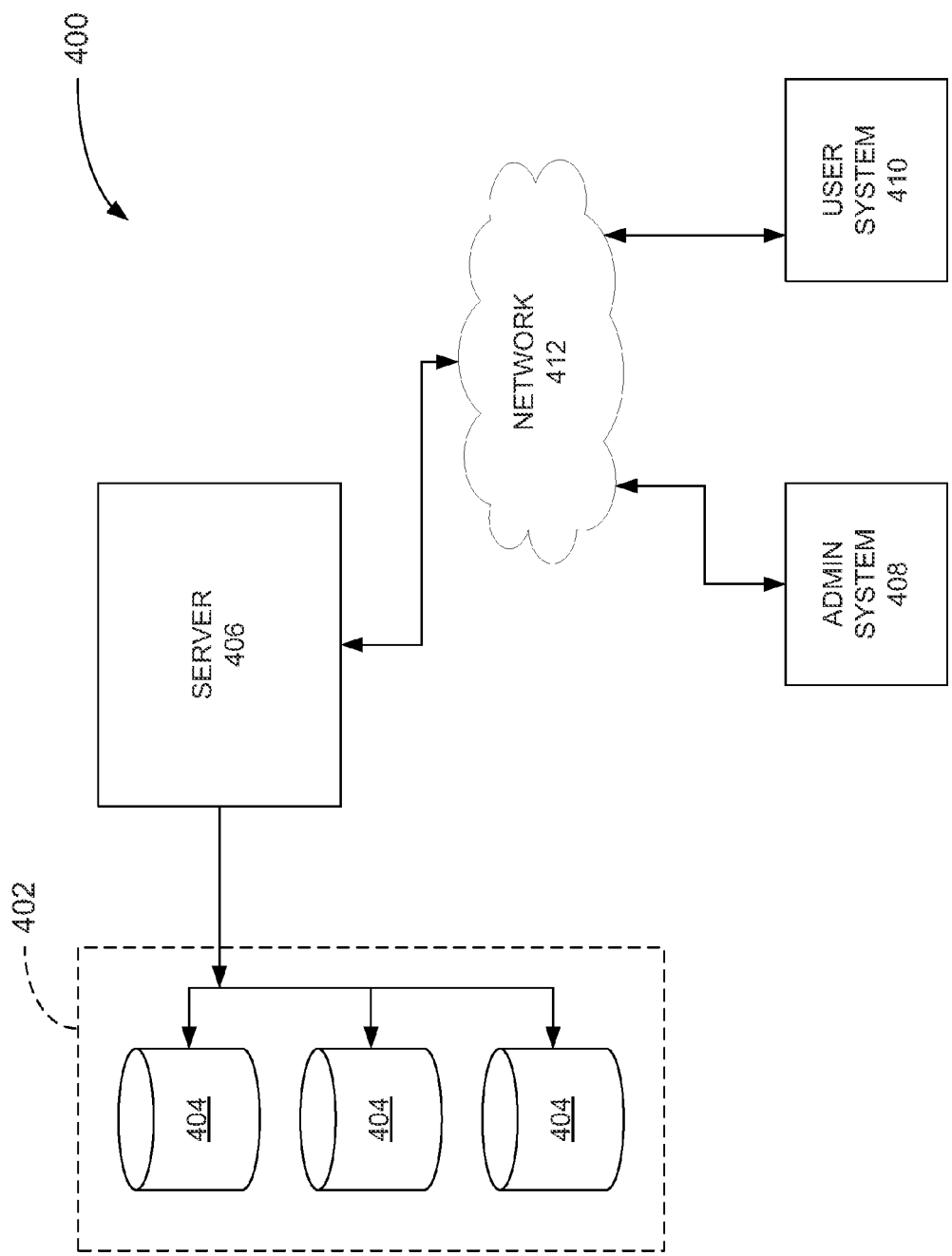
FIG. 4 is a schematic block diagram of an exemplary computer system for use in a finite element model of a repetitive structure.

FIG. 4 is a schematic block diagram of an exemplary computer system 400 for use in a finite element model of a repetitive structure, such as a periodic media transport mechanism or conveyor, and for use in performing the processes described above and/or additional processes that may be related to those described above. In an exemplary embodiment, a memory area 402 includes one or more storage devices 404 for use in storing data, such as simulation data or any other suitable data type that can be used in an FEM simulation environment. In some embodiments, the memory area 402 is coupled to a server system 406, which is in turn coupled to an administrator system 408 and/or a user system 410 via a network 412. The storage devices 404 may be embodied as one or more databases, may be located at a single or at multiple geographical sites, or may be integrated with the server system 406.

As can be appreciated, the network 412 can be a public network, such as the Internet, or a private network such as an LAN or WAN network, or any combination thereof and can also include PSTN or ISDN sub-networks. The network 412 can also be wired, such as an Ethernet network, or can be wireless such as a cellular network including EDGE, 3G, and 4G wireless cellular systems. The wireless network can also be WiFi, Bluetooth, or any other wireless form of communication that is known. Thus, the network 412 is merely exemplary and in no way limits the scope of the present advancements.

As one of ordinary skill in the art would recognize, the administrator system 408 and/or the user system 410 can be any suitable computer system such as the one described below with reference to FIG. 5, or any other computing system that is known. Moreover, it should be understood that the server system 406 is configured to perform the processes described above and/or any additional processes that may be related to those described above.

The server system 406 stores the computer-readable instructions to execute the processes described above and provides these instructions via the network 412 to the administrator system 408 and/or the user system 410. Moreover, the server system 406 can also provide data from the memory area 402 as needed to the administrator system 408 and the user system 410. As such, FIG. 4 includes implementations of the computer system 400 via cloud computing, distributed computing, and the like.

Figure 5:
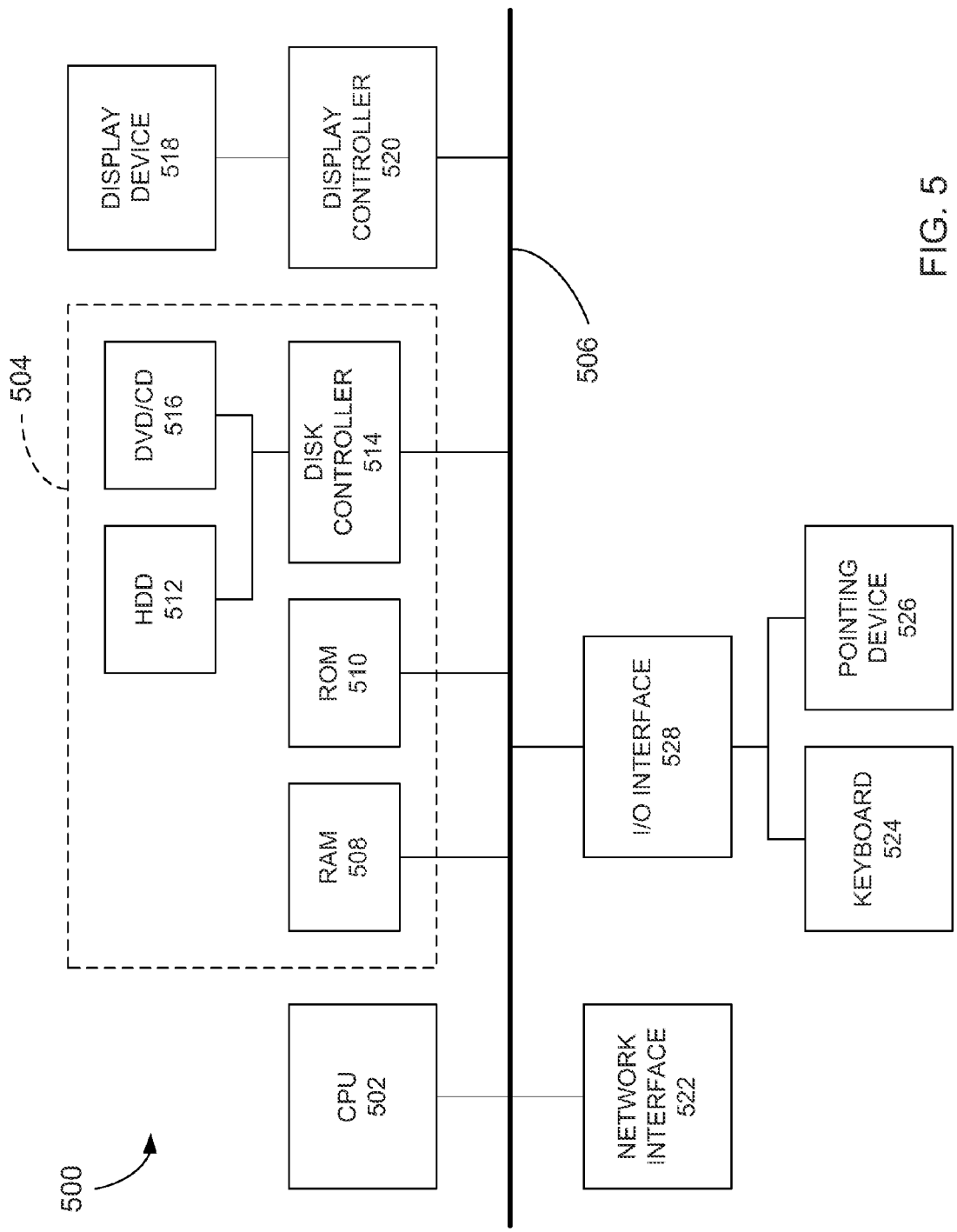
FIG. 5 is a schematic block diagram of an exemplary computer architecture for use with the computer system shown in FIG. 4.

FIG. 5 is a schematic block diagram of an exemplary computer architecture 500 for use with the server system 406, the administrator system 408, and/or the user system 410 (each shown in FIG. 4).

In an exemplary embodiment, the computer architecture 500 includes one or more processors 502 (CPU) that performs the processes described above and/or any additional processes that may be related to those described above. It should be understood that the term "processor" refers generally to any programmable system including systems and microcontrollers, reduced instruction set circuits (RISC), application-specific integrated circuits (ASIC), programmable logic circuits, and/or any other circuit or processor capable of executing the functions described herein. The above examples are exemplary only and, thus, are not intended to limit in any way the definition and/or meaning of the term "processor."

The steps of the processes described above and/or any additional processes that may be related to those described above may be stored as computer-executable instructions in, for example, a memory area 504 that is operably and/or communicatively coupled to the processor 502 by a system bus 506. A "memory area," as used herein, refers generally to any means of storing program code and instructions executable by one or more processors to aid in analysis of a repetitive structure and for use in performing the processes described above and/or additional processes that may be related to those described above. The memory area 504 may include one, or more than one, forms of memory. For example, the memory area 504 may include random-access memory (RAM) 508, which can include non-volatile RAM, magnetic RAM, ferroelectric RAM, and/or other forms of RAM. The memory area 504 may also include read-only memory (ROM) 510 and/or flash memory and/or electrically-programmable read-only memory (EEPROM). Any other suitable magnetic, optical, and/or semiconductor memory, such as a hard-disk drive (HDD) 512, by itself or in combination with other forms of memory, may be included in the memory area 504. HDD 512 may also be coupled to a disk controller 514 for use in transmitting and receiving messages to and from the processor 502. Moreover, the memory area 504 may also be, or may include, a detachable or removable memory 516, such as a suitable cartridge disk, CD-ROM, DVD, or USB memory. The above examples are exemplary only and, thus, are not intended to limit in any way the definition and/or meaning of the term "memory area."

The computer architecture 500 also includes a display device 518 that is coupled, such as operatively coupled, to a display controller 520. The display controller 520 receives data via the system bus 506 for display by the display device 518. The display device 518 may be, without limitation, a monitor, a television display, a plasma display, a liquid crystal display (LCD), a display based on light-emitting diodes (LED), a display based on organic LEDs (OLED), a display based on polymer LEDs, a display based on surface-conduction electron emitters, a display including a projected and/or reflected image, or any other suitable electronic device or display mechanism. Moreover, the display device 518 may include a touchscreen with an associated touchscreen controller. The above examples are exemplary only and, thus, are not intended to limit in any way the definition and/or meaning of the term "display device."

In addition, the computer architecture 500 includes a network interface 522 for use in communicating with a network (not shown in FIG. 5). Moreover, the computer architecture 500 includes one or more input devices, such as a keyboard 524 and/or a pointing device 526, such as a roller ball, mouse, touchpad, and the like. The input devices are coupled to and controlled by an input/output (I/O) interface 528, which is further coupled to the system bus 506.

A description of the general features and functionality of the display device 518, keyboard 524, pointing device 526, as well as the display controller 520, disk controller 514, network interface 522, and I/O interface 528 is omitted herein for brevity as these features are known.

Exemplary embodiments of systems, methods, apparatuses, and computer program products for use in analyzing a model of a repetitive structure are described above in detail. The systems, methods, apparatuses, and computer program products are not limited to the specific embodiments described herein but, rather, operations of the methods and/or components of the system and/or apparatus may be utilized independently and separately from other operations and/or components described herein. Further, the described operations and/or components may also be defined in, or used in combination with, other systems, methods, and/or apparatus, and are not limited to practice with only the systems, methods, and storage media as described herein.

A computer system or server system, such as those described herein, includes at least one processor or processing unit and a system memory. The computer system or server system typically has at least some form of computer readable media. By way of example and not limitation, computer readable media include computer storage media and communication media. Computer storage media include volatile and nonvolatile, removable and non-removable media implemented in any method or technology for storage of information such as computer readable instructions, data structures, program modules, or other data. Communication media typically embody computer readable instructions, data structures, program modules, or other data in a modulated data signal such as a carrier wave or other transport mechanism and include any information delivery media. Those skilled in the art are familiar with the modulated data signal, which has one or more of its characteristics set or changed in such a manner as to encode information in the signal. Combinations of any of the above are also included within the scope of computer readable media.

Exemplary computer-executable components for use the processes described above include, but are not limited to only including, a construction component that causes a processor, such as processor 502 (shown in FIG. 5), to generate a plurality of blocks based on an FEM meshed model such that the blocks are arranged end to end. The components also include a rules component that causes the processor 502 to define one or more boundary conditions on an inlet of the model and on an outlet of the model, generate one or more constraints to be applied to the blocks to define connectivity between adjacent blocks, and define an inlet state based on the boundary conditions and the constraints. Furthermore, the components include an analysis component that causes the processor 502 to detect when a first block passes a trigger plane at the inlet of the model, erase a state of a second block at the outlet of the model, and reset the state of the second block to the inlet state.

In some embodiments, the construction component also causes the processor 502 to construct a finite element model part mesh representative of the repetitive structure. Moreover, in some embodiments, the construction component causes the processor 502 to define one or more secondary finite element model entities to interact with the blocks.

In some embodiments, the rules component causes the processor 502 to define the trigger plane to indicate a geometric region where a valid finite element model part mesh of the repetitive structure is to exist.

In some embodiments, the analysis component causes the processor 502 to uncouple the constraints between the second block and a third block that trails the second block, and to couple the constraints between the second block and the first block. Moreover, in some embodiments, the analysis component causes the processor 502 to define a specified step time, divide the step time into a plurality of increments, and obtain and store in a memory area a solution for each of the time increments.

Although the present invention is described in connection with an exemplary simulation system environment, embodiments of the invention are operational with numerous other general purpose or special purpose simulation system environments or configurations. The simulation system environment is not intended to suggest any limitation as to the scope of use or functionality of any aspect of the invention. Moreover, the simulation system environment should not be interpreted as having any dependency or requirement relating to any one or combination of components illustrated in the exemplary operating environment.

Embodiments of the invention may be described in the general context of computer-executable instructions, such as program components or modules, executed by one or more computers or other devices. Aspects of the invention may be implemented with any number and organization of components or modules. For example, aspects of the invention are not limited to the specific computer-executable instructions or the specific components or modules illustrated in the figures and described herein. Alternative embodiments of the invention may include different computer-executable instructions or components having more or less functionality than illustrated and described herein.

The order of execution or performance of the operations in the embodiments of the invention illustrated and described herein is not essential, unless otherwise specified. That is, the operations may be performed in any order, unless otherwise specified, and embodiments of the invention may include additional or fewer operations than those disclosed herein. For example, it is contemplated that executing or performing a particular operation before, contemporaneously with, or after another operation is within the scope of aspects of the invention.

When introducing elements of aspects of the invention or embodiments thereof, the articles "a," "an," "the," and "said" are intended to mean that there are one or more of the elements. The terms "comprising," including," and "having" are intended to be inclusive and mean that there may be additional elements other than the listed elements.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. A computer-implemented method for use in analyzing a model of a repetitive structure, said method comprising, in a processor:
   generating a plurality of blocks based on the repetitive structure model such that the plurality of blocks is arranged end to end;
   defining at least one boundary condition on an inlet of the repetitive structure model and on an outlet of the repetitive structure model;
   generating a plurality of tie constraints to be applied to the plurality of blocks to define how adjacent blocks are coupled and decoupled, without defining coupling characteristics between a block at the inlet of the repetitive structure model and a block at the outlet of the repetitive structure model that would form a continuous loop of blocks;
   defining an inlet state based on the at least one boundary condition and at least a portion of the plurality of constraints;
   detecting when a first block of the plurality of blocks passes a trigger plane at the inlet of the repetitive structure model;
   erasing a state of a second block of the plurality of blocks at the outlet of the repetitive structure model to at least de-couple one or more constraints on the second block from the opposing constraints of a third block adjacent to the second block;
   resetting the state of the second block to the inlet state to at least couple one or more tie constraints on the second block to opposing constraints of the first block;
   uncoupling the plurality of constraints between the second block and a third block that trails the second block; and
   coupling the plurality of constraints between the second block and the first block.

2. A computer-implemented method in accordance with claim 1, wherein generating a plurality of blocks comprises constructing a finite element model part mesh representative of the repetitive structure.

3. A computer-implemented method in accordance with claim 1, wherein generating a plurality of blocks comprises generating the plurality of blocks having differing geometries.

4. A computer-implemented method in accordance with claim 1, further comprising defining the trigger plane to indicate a geometric region where a valid finite element model part mesh of the repetitive structure is to exist.

5. A computer-implemented method in accordance with claim 1, wherein generating a plurality of constraints comprises generating one of node-to-node constraints and surface-to-surface constraints.

6. A computer-implemented method in accordance with claim 1, further comprising defining one or more secondary finite element model entities to interact with the plurality of blocks.

7. A computer-implemented method in accordance with claim 1, further comprising:
   defining a specified step time;
   dividing the step time into a plurality of increments; and obtaining and storing in a memory area a solution for each of the plurality of time increments.

8. A computer for use in analyzing a model of a repetitive structure, said computer comprising:
a memory area; and
a processor operatively coupled to said memory area and configured to:
generate a plurality of blocks based on the repetitive structure model such that the plurality of blocks is arranged end to end, without defining connectivity between a block at the inlet of the repetitive structure model and a block at the outlet of the repetitive structure model that would form a continuous loop of blocks;
store data representative of the plurality of blocks in said memory area;
define at least one boundary condition on an inlet of the repetitive structure model and on an outlet of the repetitive structure model;
automatically generate a plurality of tie constraints to be applied to the plurality of blocks to define how adjacent blocks are coupled and decoupled;
define an inlet state based on the at least one boundary condition and at least a portion of the plurality of constraints;
detect when a first block of the plurality of blocks passes a trigger plane at the inlet of the repetitive structure model;
erase a state of a second block of the plurality of blocks at the outlet of the repetitive structure model to at least de-couple one or more constraints on the second block from the opposing constraints of a third block adjacent to the second block;
reset the state of the second block to the inlet state to at least couple one or more constraints on the second block to opposing constraints of the first block;
store data representative of the operation of the repetitive structure model in said memory area;
uncouple the plurality of constraints between the second block and a third block that trails the second block; and
couple the plurality of constraints between the second block and the first block.

9. A computer in accordance with claim 8, wherein said processor is configured to generate a plurality of blocks by constructing a finite element model part mesh representative of the repetitive structure.

10. A computer in accordance with claim 8, wherein said processor is further configured to define the trigger plane to indicate a geometric region where a valid finite element model part mesh of the repetitive structure is to exist.

11. A computer in accordance with claim 8, wherein the plurality of constraints includes one of node-to-node constraints and surface-to-surface constraints.

12. A computer in accordance with claim 8, wherein said processor is further configured to define one or more secondary finite element model entities to interact with the plurality of blocks.

13. A computer program product for use in analyzing a model of a repetitive structure, said computer program product comprising one or more non-transitory computer-readable storage media having computer-executable components, said components comprising:

a construction component that when executed by at least one processor causes the at least one processor to generate a plurality of blocks based on the repetitive structure model such that the plurality of blocks is arranged end to end;
a rules component that when executed by at least one processor causes the at least one processor to:
define at least one boundary condition on an inlet of the repetitive structure model and on an outlet of the repetitive structure model;
generate a plurality of tie constraints to be applied to the plurality of blocks to define how adjacent blocks are coupled and decoupled, without defining coupling characteristics between a block at the inlet of the repetitive structure model and a block at the outlet of the repetitive structure model that would form a continuous loop of blocks; and
define an inlet state based on the at least one boundary condition and at least a portion of the plurality of constraints; and
an analysis component that when executed by the at least one processor causes the at least one processor to:
detect when a first block of the plurality of blocks passes a trigger plane at the inlet of the repetitive structure model;
erase a state of a second block of the plurality of blocks at the outlet of the repetitive structure model to at least de-couple one or more constraints on the second block from the opposing constraints of a third block adjacent to the second block;
reset the state of the second block to the inlet state to at least couple one or more constraints on the second block to opposing constraints of the first block;
uncouple the plurality of constraints between the second block and a third block that trails the second block; and
couple the plurality of constraints between the second block and the first block.

14. A computer program product in accordance with claim 13, wherein said construction component causes the at least one processor to construct a finite element model part mesh representative of the repetitive structure.

15. A computer program product in accordance with claim 13, wherein said rules component causes the at least one processor to define the trigger plane to indicate a geometric region where a valid finite element model part mesh of the repetitive structure is to exist.

16. A computer program product in accordance with claim 13, wherein said construction component causes the at least one processor to define one or more secondary finite element model entities to interact with the plurality of blocks.

17. A computer program product in accordance with claim 13, wherein said analysis component causes the at least one processor to:
define a specified step time;
divide the step time into a plurality of increments; and
obtain and store in a memory area a solution for each of the plurality of time increments.

* * * * *